United States Patent [19]
Kamijima

[11] Patent Number: 5,721,078
[45] Date of Patent: Feb. 24, 1998

[54] MAGNETORESISTANCE THIN FILM ELEMENT FORMED THROUGH USE OF A RESIST PATTERN OF T-SHAPED CROSS SECTION

[75] Inventor: Akifumi Kamijima, Tokyo, Japan

[73] Assignee: TDK Corporation, Tokyo, Japan

[21] Appl. No.: 757,629

[22] Filed: Dec. 2, 1996

Related U.S. Application Data

[62] Division of Ser. No. 686,911, Jul. 26, 1996.

[30] Foreign Application Priority Data

Jul. 26, 1995 [JP] Japan ............... 7-209950

[51] Int. Cl.⁶ ............... G03F 7/023; G03F 7/11
[52] U.S. Cl. ............... 430/11; 430/17; 430/166; 430/191
[58] Field of Search ............... 430/11, 17, 166, 430/311, 325, 326, 330, 191

[56] References Cited

PUBLICATIONS

IEEE Transactions of Magnetics, vol. 32, No. 1, pp. 25–30, Jan. 1996, Banbock et al, "MR Head Wafer Fabrication Technology: Current & Future Perspectives".

*Primary Examiner*—Christopher G. Young
*Attorney, Agent, or Firm*—Oblon, Spivak, McClelland, Maier & Neustadt, P.C.

[57] ABSTRACT

A resist pattern formed on a substrate has a T-shaped cross section including a stem portion extending from the substrate surface and a cap portion connected to the stem portion and spaced from the substrate surface. Provided that α is a minimum of the angle which is defined between a tangent at the lower edge of the cap portion and the substrate surface, and h is the spacing between the lower edge of the cap portion and the substrate surface at an intermediate position, α and h fall within a range defined and encompassed by tetragon ABCD wherein A: α=0°, h=0.01 μm, B: α=20°, h=0.01 μm, C: α=20°, h=0.2 μm, and D: α=0°, h=0.3 μm. In a patterning process including the steps of coating of a resist composition to form a resist coating, exposure, reversal baking and development, at least one condition is changed by reducing the thickness of the resist coating, reducing an exposure dose, lowering a reversal baking temperature, reducing a reversal baking time, increasing a developer temperature or extending a developing time such that a resist pattern of T-shaped cross section may be formed.

21 Claims, 14 Drawing Sheets

FIG. 2A
SUBSTRATE
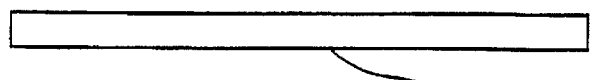
FIG. 2B
FORMING A FILM TO BE MILLED
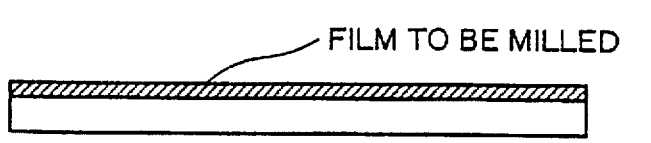
FIG. 2C
RESIST PATTERNING
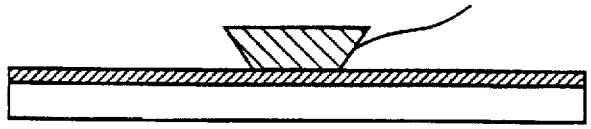
FIG. 2D
MILLING
FIG. 2E
PEELING RESIST
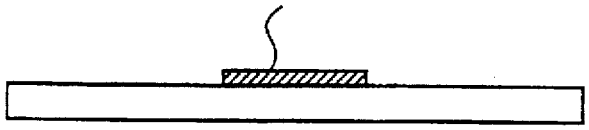
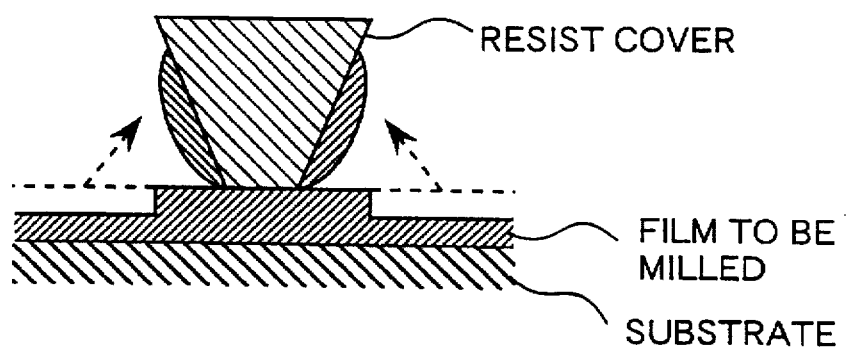
FIG. 3

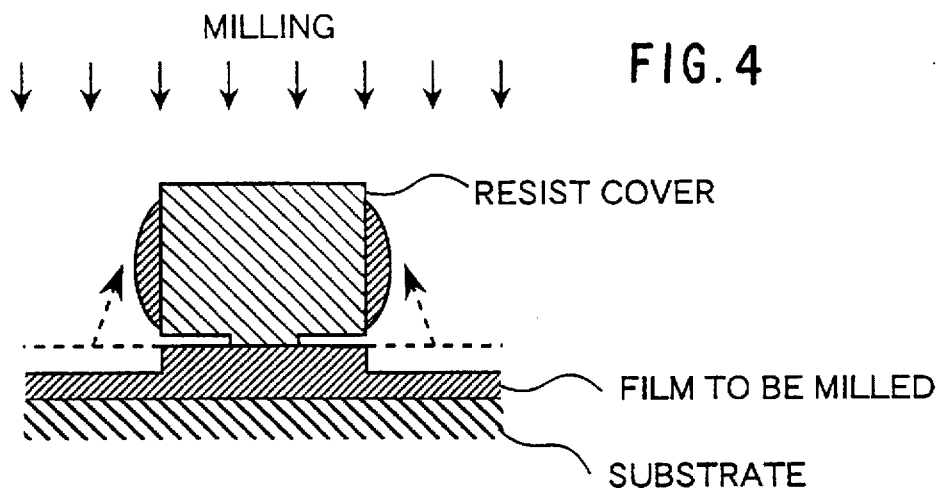
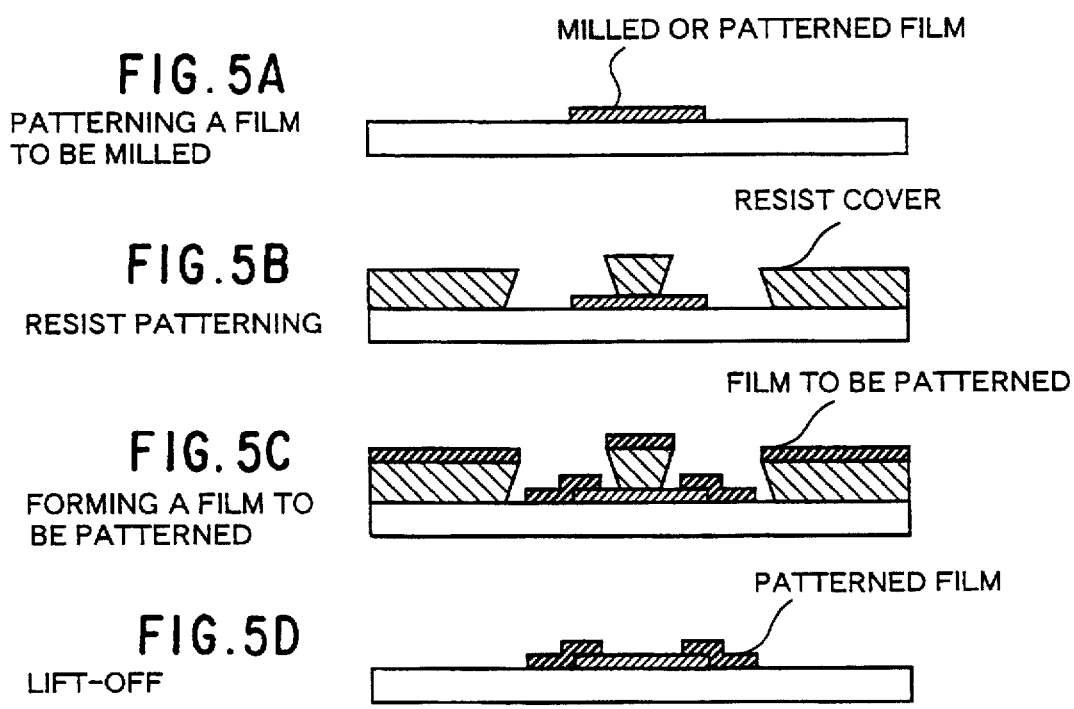

SUBSTRATE

FORMING A FILM TO BE MILLED

RESIST PATTERNING

MILLING

FILM FORMATION

PEELING RESIST

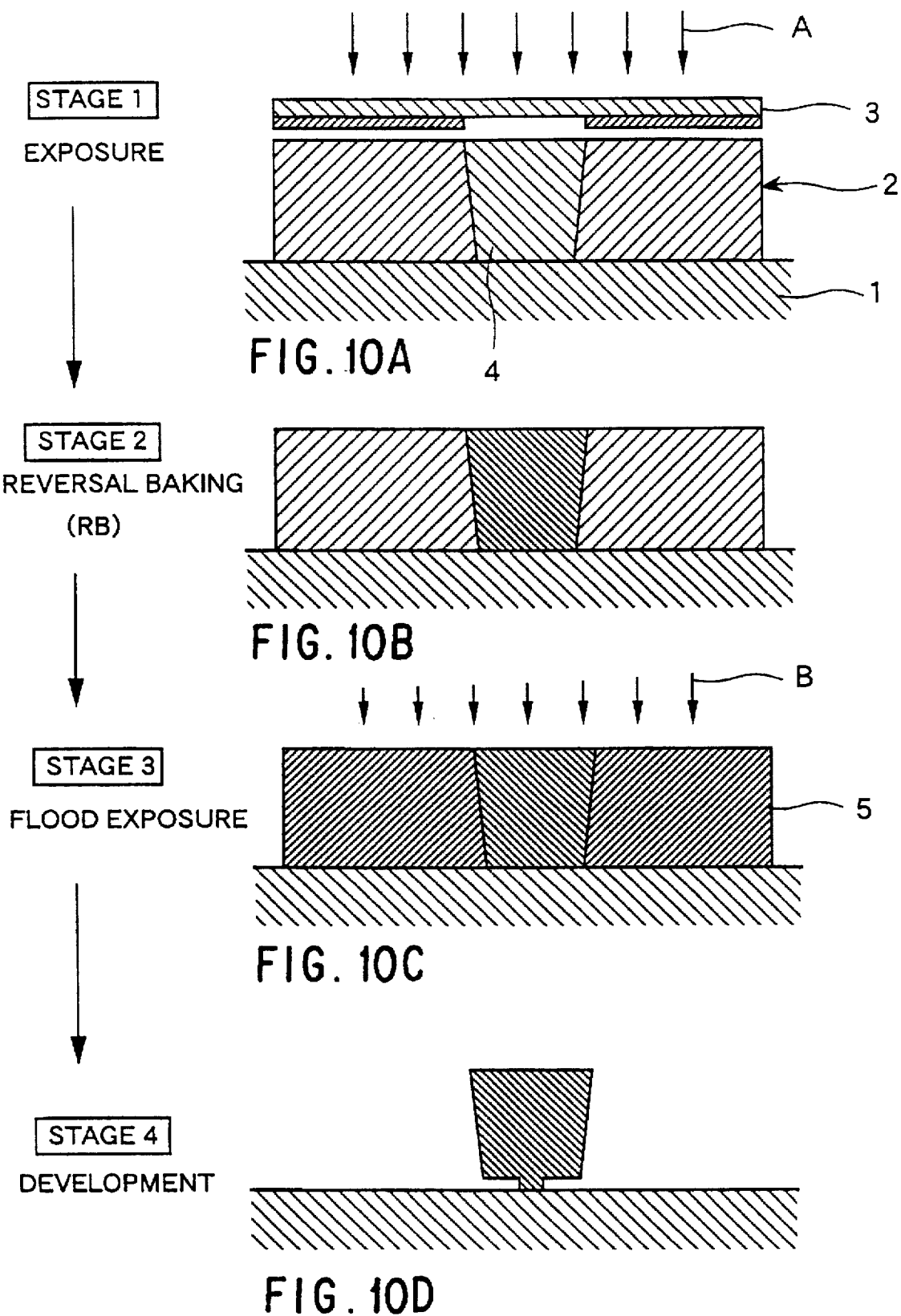

DIAZONAPHTHOQUINONE     INDENECARBOXYLIC ACID

SCHEME 1

INDENECARBOXYLIC ACID     AMINE SALT OF CARBOXYLIC ACID

SCHEME 2

AMINE SALT OF CARBOXYLIC ACID     INDENE

SCHEME 3

⊢―――⊣ 1.0 μm

⊢――――⊣
0.4 μm 0.36 μm

|—| 0.5 μm

PRIOR ART

PRIOR ART

MAGNETORESISTANCE THIN FILM ELEMENT FORMED THROUGH USE OF A RESIST PATTERN OF T-SHAPED CROSS SECTION

This is a Division of application Ser. No. 08/686,911 filed on Jul. 26, 1996, now pending.

BACKGROUND OF THE INVENTION

1. Field of the Invention

This invention relates to a resist pattern of T-shaped cross section, its preparation, and a magnetoresistance thin film element comprising a magnetoresistance film, an electrode film therefor, and a shield film at least one of which is formed using the resist pattern.

2. Prior Art

Several methods are known in the art for forming resist patterns of inverted trapezoidal or T-shaped cross section.

(A) Resist patterns of inverted trapezoidal cross section are formed using single layer resists. In one process (a), a single layer of negative resist is used. For example, a resist pattern is formed by exposing a negative resist coating to UV radiation by a conventional technique except that the dose of exposure is reduced, followed by patterning as disclosed in Japanese Patent Application (JP-A) No. 136226/1986.

In another process (b), a single layer of positive resist is used. There are known several variants which are described below. (i) The substrate side of a resist is set at a lower temperature than the surface side during prebaking and postbaking steps. The temperature control during prebaking is described in JP-A 72678/1979 and the temperature control during postbaking is described in JP-A 101218/1991. (ii) A positive resist film for electron beams is exposed to deep-UV radiation as disclosed in JP-A 50423/1989. (iii) A novolak resist is coated and maintained in high vacuum prior to exposure as disclosed in JP-A 257817/1991. (iv) A resist coating on a transparent substrate is exposed to UV radiation from both the front and rear surfaces as disclosed in JP-A 37275/1993. (v) When a positive resist is exposed to electron beams, the exposure time is reduced by once forming a pattern portion and a non-pattern portion, forming a protective film thereon, and removing the non-pattern portion utilizing the protective film as disclosed in JP-A 147261/1976. (vi) A resist polymer having a desired coefficient of UV absorption is used or a resist having a controlled amount of crosslinking agent added is used as disclosed in JP-A 16527/1983. (vii) A photoresist colored with a dye capable of absorbing exposure light is coated onto a substrate and the coating is dipped in a solvent to control the distribution of coloring density in the resist in a thickness direction as disclosed in JP-A 284851/1989.

In a further process (c), a single layer of positive resist having an image reversal function is used. Typically resists commercially available from. Hoechst under the trade name of Resist AZ5200E series are used. A method for forming a resist pattern of inverted trapezoidal cross section using these resists is known. Reference is made to the brochure of Resist AZ5200E series, M. Bolzen, "Submicron processing technology by image reversal of positive photoresists," Densi-Zairyo (Electronic Material), 6, 1 (1986), and M. Spac et al., "Mechanism and lithographic evaluation of image reversal in AZ5214 photoresist," Proc. of conference on photopolymers principle processing and materials, Ellenville (1985). These resist materials are obtained by adding negative working agents such as basic amines to positive resist compounds comprising a mixture of alkali soluble phenol resin and naphthoquinonediazide for imparting an image reversal function.

(B) Resist patterns of T-shaped cross section are also known. One method uses a single layer of resist. A negative resist is exposed using two types of charged beams having different ranges in the resist as disclosed in JP-A 105423/1987. It is seen from the patent publication that a pattern of T-shaped cross section changes into a pattern of rectangular cross section as a result of shrinkage after rinsing and drying. Another method uses dual layers of positive resist. (i) Double exposure is carried out in appropriate doses. First exposure in a predetermined dose corresponds to a predetermined pattern shape and second exposure in a predetermined dose corresponds to a center portion of the same pattern shape (see JP-A 141548/1987). (ii) Upper and lower layers of electron beam resist separated by an intervening layer are simultaneously exposed to a predetermined pattern (see JP-B 55208/1988). (iii) On the surface of a first photoresist film is formed a modified layer which is resistant to development of a second photoresist film (see JP-A 65139/1990). (iv) A resist film of two layer structure is provided wherein a pattern opening in the lower layer of resist at its upper surface is wider than a pattern opening in the upper layer of resist at its lower surface (see JP-A 208934/1990).

Among the above-described prior art techniques, most techniques form resist patterns of inverted trapezoidal cross section. Some techniques can form resist patterns of T-shaped cross section, but are very difficult to carry out in practice since two layers of resist must be used or exposure must be done twice.

Methods for forming electrode patterns on substrates include a lift-off method, a milling patterning method, and a combined one. These methods are briefly described as well as the reason why resist patterns of T-shaped cross section are desirable.

Milling Patterning

A method for forming a pattern by ion milling is shown in FIG. 2. The method involves the steps of forming a film to be milled over the entire surface of a substrate, forming a resist layer thereon, patterning the resist layer into a resist cover, and ion milling the film through the resist cover as a mask. Thereafter, the resist cover is removed by dissolving in organic solvent or reducing to ashes, obtaining a milled or patterned film.

In the case of a resist cover of rectangular or inverted trapezoidal cross section as in prior art examples, there is a possibility that when a film to be milled is etched by the ion milling technique, particles which are etched out of the film scatter and deposit on the side wall of the resist cover again and the deposit grow from the side wall so as to be continuous to the surface of the film being milled as seen from FIG. 3. When the resist cover is removed, the re-deposited layer can be left as minute protrusions on the surface of the milled film.

In the case of a resist cover of T-shaped cross section, although particles which are etched out of the film scatter and deposit on the resist cover again, the deposit layer will not grow to be continuous to the surface of the film being milled insofar as the neck portion at the bottom of the resist cover is high enough as seen from FIG. 4. Then when the resist cover is removed, the re-deposited layer is removed therewith. A milled or patterned film of quality is obtained since the re-deposited layer is never left on the surface of the milled film.

Lift-off

The lift-off process is described by referring to the formation of another patterned film on the above-mentioned milled and patterned film. This lift-off process is used when a lead layer is formed on a magnetoresistance film, for example.

One exemplary lift-off process is described with reference to FIG. 5. A substrate having a film to be milled is furnished. Step (1) is to mill or pattern the film on the substrate. Step (2) is to apply a resist layer on the milled or pattern film and pattern it into a resist cover. In step (3), a film of metal or ceramics to be patterned is formed over the entire surface of the substrate including the patterned resist cover. In step (4), the structure is dipped in an organic solvent capable of dissolving away the resist cover, thereby removing those portions of the film overlying the resist cover while those portions of the film in direct contact with the substrate are left. A patterned film is formed in this way.

This process requires that the organic solvent fully penetrate through the resist. When the resist pattern has an inverted trapezoidal cross section as in prior art examples, however, the film as deposited can contact the resist pattern side wall too to cover the resist pattern as shown in FIG. 6. This extra coverage prevents the organic solvent from fully penetrating through the resist pattern, failing to remove the resist pattern.

In contrast, in the case of a resist pattern having a T-shaped cross section wherein the height of a neck portion at the bottom of the resist pattern is less than the thickness of a film deposited over the entire surface of a substrate, as shown in FIG. 7, while a film is deposited on the top and side wall of eaves of a resist pattern during deposition, no film is deposited near the neck portion which is shaded by the eaves of the resist pattern. Consequently, the deposited film does not completely cover the resist pattern. Since the organic solvent can penetrate into the resist pattern through the neck portion, that portion of the deposited film overlying the resist pattern can be removed together with the resist pattern.

Combined Milling Patterning/Lift-off

One exemplary combined milling patterning/lift-off process is described with reference to FIG. 8. In step (2), a film to be milled is formed over the entire surface of a substrate. In step (3), a resist layer is formed thereon and patterned into a resist cover. The resist cover is of inverted trapezoidal cross section in the illustrated example. Then the film on the substrate is patterned through the resist cover by ion milling at step (4). The resist cover which has been used for the milling purpose is not removed, but utilized further as a resist cover for a subsequent lift-off step. In step (5), metal or ceramic material is deposited on the entire surface of the substrate. By dissolving away the resist cover with an organic solvent, that portion of the deposited film on the resist cover is removed together with the resist cover. As shown in step (6), a continuous film consisting of the milled film portion and the deposited film portion left after the lift-off step is obtained on the substrate surface.

In the case of a resist cover of rectangular or inverted trapezoidal cross section as in prior art examples, there is a possibility that the finally obtained continuous film contains minute protrusions left at the boundary between the milled film portion and the deposited film portion left after the lift-off step for the above-described reason. Sometimes, the resist cover cannot be removed.

In the case of a resist cover of T-shaped cross section, these problems do not occur for the above-described reason. A satisfactory continuous film consisting of the milled film portion and the deposited film portion left after the lift-off step is obtained on the substrate surface.

The prior art is successful in producing a resist pattern of inverted trapezoidal cross section from a single layer of resist, but unsuccessful in producing a resist pattern of T-shaped cross section at an acceptable contrast. FIGS. 17 to 20 show prior art resist patterns of inverted trapezoidal cross section produced from a single layer of resist, which are duplicates from the brochure of AZ5200E. The radiation used for patterning is excimer laser light in FIG. 17, i-line in FIG. 18, g-line in FIG. 19, and broad band light inclusive of i, g and h-lines in FIG. 20. Any type of radiation fails to form a pattern of T-shaped cross section.

If one attempts to form a resist pattern of T-shaped cross section in accordance with a prior art technique using two layers of resist, the process is not only laborious, but fails to produce a resist pattern of T-shaped cross section at an acceptable contrast because intermixing between the resist layers occurs at their interface.

As a consequence, a resist pattern of T-shaped cross section with an acceptable contrast is never available in the prior art. If an electrode pattern for a magnetoresistance film of a magnetoresistance thin film element is formed using a prior art resist pattern of indefinite T-shaped cross section, the probability that the electrode material will be left at areas other than the necessary electrode pattern is high, resulting in a high percentage of rejection.

SUMMARY OF THE INVENTION

Therefore, an object of the present invention is to provide a resist pattern of T-shaped cross section with an acceptable contrast which is useful in the manufacture of an electrode pattern for a magnetoresistance thin film element with the advantage of a significantly reduced percentage of rejected parts.

Another object is to provide a magnetoresistance thin film element comprising an electrode pattern or the like formed using the resist pattern.

In a first aspect, the present invention provides a substantially homogeneous resist pattern which is formed on a surface of a substrate from a resist composition comprising a positive resist compound containing a mixture of an alkali soluble phenol resin and a naphthoquinonediazide and a negative working agent added to the positive resist compound for imparting an image reversal function. The resist pattern has a T-shaped cross section including a stem portion extending from the substrate surface and substantially constituting the vertical bar of T and a cap portion connected to the stem portion, opposed to the substrate surface with a spacing and substantially constituting the horizontal bar of T. Provided that $\alpha$ is a minimum of the angle which is defined between a tangent at the lower edge of said cap portion opposed to the substrate surface and the substrate surface, and h is the spacing between the lower edge of the cap portion and the substrate surface at an intermediate position between the crossing Wo between a line extending from the outermost edge of the cap portion perpendicular to the substrate surface and the substrate surface and the crossing Wi between the side edge of the stem portion and the substrate surface, the minimum angle $\alpha$ and the spacing h fall within a range defined and encompassed by tetragon ABCD in a h-$\alpha$ graph wherein A: $\alpha=0°$, h=0.01 μm,
B: $\alpha=20°$, h=0.01 μm,
C: $\alpha=20°$, h=0.2 μm, and D: α=0°, h=0.3 μm.

In one preferred embodiment, α and h fall within a range defined and encompassed by tetragon AXYZ in the h-α graph wherein A: α=0°, h=0.01 μm, X: α=5°, h=0.01 μm, Y: α=5°, h=0.15 μm, and Z: α=0°, h=0.15 μm. In a further preferred embodiment, α and h fall within a range defined and encompassed by tetragon AXGH in the h-α graph wherein A: α=0°, h=0.01 μm, X: α=5°, h=0.01 μm, G: α=5°, h=0.1 μm, and H: α=0°, h=0.1 μm.

Preferably, the distance W between the crossings Wo and Wi is 0.03 to 3 μm. Preferably, the cap portion has a maximum width Hw of 0.1 to 7 μm as measured parallel to the substrate surface. Preferably, the stem portion has a width Vw adjacent to the substrate surface wherein Vw/Hw is from 0.1 to 0.995. At least the substrate surface is preferably formed of a metal or ceramic material.

In a second aspect, the present invention provides a method for preparing a resist pattern by a patterning process comprising the steps of coating of a resist composition to form a resist coating, exposure, reversal baking and development in the described order, said resist composition comprising a positive resist compound containing a mixture of an alkali soluble phenol resin and a naphthoquinonediazide and a negative working agent added to the positive resist compound for imparting an image reversal function. According to the invention, among process conditions allowing a resist pattern of inverted trapezoidal cross section to be formed, at least one condition is changed by reducing the thickness of the resist coating, reducing an exposure dose, lowering a reversal baking temperature, reducing a reversal baking time, increasing a developer temperature or extending a developing time such that a resist pattern of T-shaped cross section may be formed.

Preferably, upon exposure of the resist coating, light for exposure has a focal point within the range between −1 μm to +10 μm with respect to the surface of the resist coating provided that a direction toward the substrate is expressed negative and a direction away from the substrate is expressed positive. The reversal baking is preferably effected at a temperature of 100° to 123° C. for 30 seconds to 13 minutes. Typically, the resist pattern has the T-shaped cross section defined in the first aspect.

In a further aspect of the invention, there are provided a magnetoresistance thin film element comprising a magnetoresistance film and an electrode film therefor, at least one layer of which is formed by a lift-off technique using a resist pattern of T-shaped cross section as defined above as a resist cover; a magnetoresistance thin film element comprising a magnetoresistance film, an electrode film therefor, and a shield film, at least one layer of which is formed by a milling patterning technique using a resist pattern of T-shaped cross section as defined above as a resist cover; and a magnetoresistance thin film element comprising a patterned continuous film constituting a magnetoresistance film and an electrode film therefor, said films being formed by a milling patterning and lift-off technique using a resist pattern of T-shaped cross section as defined above as a resist cover.

According to the present invention, a resist pattern of T-shaped cross section is produced by utilizing a single layer of resist, that is, entirely homogeneous resist, and controlling patterning conditions as defined above.

In the resist pattern of T-shaped cross section according to the invention which is entirely formed of homogeneous resist material on a substrate, the minimum angle α and the spacing h, both defined above, fall within the range defined and encompassed by tetragon ABCD, which means that the T-shaped cross section has high contrast. When an electrode pattern or the like for a magnetoresistance thin film element is formed using this resist pattern, the rejection rate can be significantly reduced. An acceptance rate of 100% is achievable at best.

Prior to the filing of the basic application (Japanese Patent Application No. 209950/1995) of the present application, there was known no example of forming a pattern of T-shaped cross section from a single layer of resist through a single step of imagewise exposure. A pattern of T-shaped cross section is described in IEEE TRANSACTIONS ON MAGNETICS, Vol. 32, No. 1, January 1996, pages 25–30, published after the filing of the basic application. In this article, it is determined how the amount of redeposited material left after lift-off is affected by a change of exposure dose and the temperature of post-exposure baking (corresponding to reversal baking in the present disclosure), with the results being reported in Table 3. However, the article is silent about the magnitude of exposure dose and baking temperature and the type of resist used. The resist pattern was formed using broad band light (i-line being cut) as exposure light and reported in Table 3 as having a cross section overall width (W) of 3.6 μm or more and a T's stem portion height (H) of 0.2 μm or more. It is noted that the type of exposure light is judged from the exposure equipment used in the article.

The pertinent article uses a silicon wafer as a substrate and presents a SEM photograph of a cross section of the substrate and the resist pattern as FIG. 4. Insofar as FIG. 4 is concerned, it is believed that the resist pattern is formed directly on the surface of a silicon wafer. However, we empirically found it impossible to form a resist pattern of T-shaped cross section directly on a silicon wafer. A resist pattern is likely to separate from a silicon wafer because a resist as used in the present invention is less adhesive to a silicon wafer, a resist pattern of T-shaped cross section has a narrow contact area with the substrate, and a fine resist pattern is formed using i-line in a preferred embodiment of the invention. In spite of these problems, the present invention enables formation of a fine pattern of T-shaped cross section by controlling the patterning conditions as defined above and using a substrate having a surface other than Si and $SiO_2$. In contrast, the pertinent article refers nowhere to a fine resist pattern of T-shaped cross section formed using i-line.

BRIEF DESCRIPTION OF THE DRAWINGS

These and further features of the present invention will be apparent with reference to the following description and drawings, wherein:

FIG. 2 illustrates steps of a conventional milling process.

FIG. 3 schematically illustrates the step of milling a film through a resist pattern of inverted trapezoidal cross section, showing deposition of milled material on the resist side wall.

FIG. 4 schematically illustrates the step of milling a film through a resist pattern of T-shaped cross section, showing deposition of milled material on the resist side wall.

FIG. 5 illustrates steps of a conventional lift-off process.

FIG. 10 illustrates steps of a process for patterning image reversal type positive resist.

DETAILED DESCRIPTION OF THE INVENTION

Figure 1:
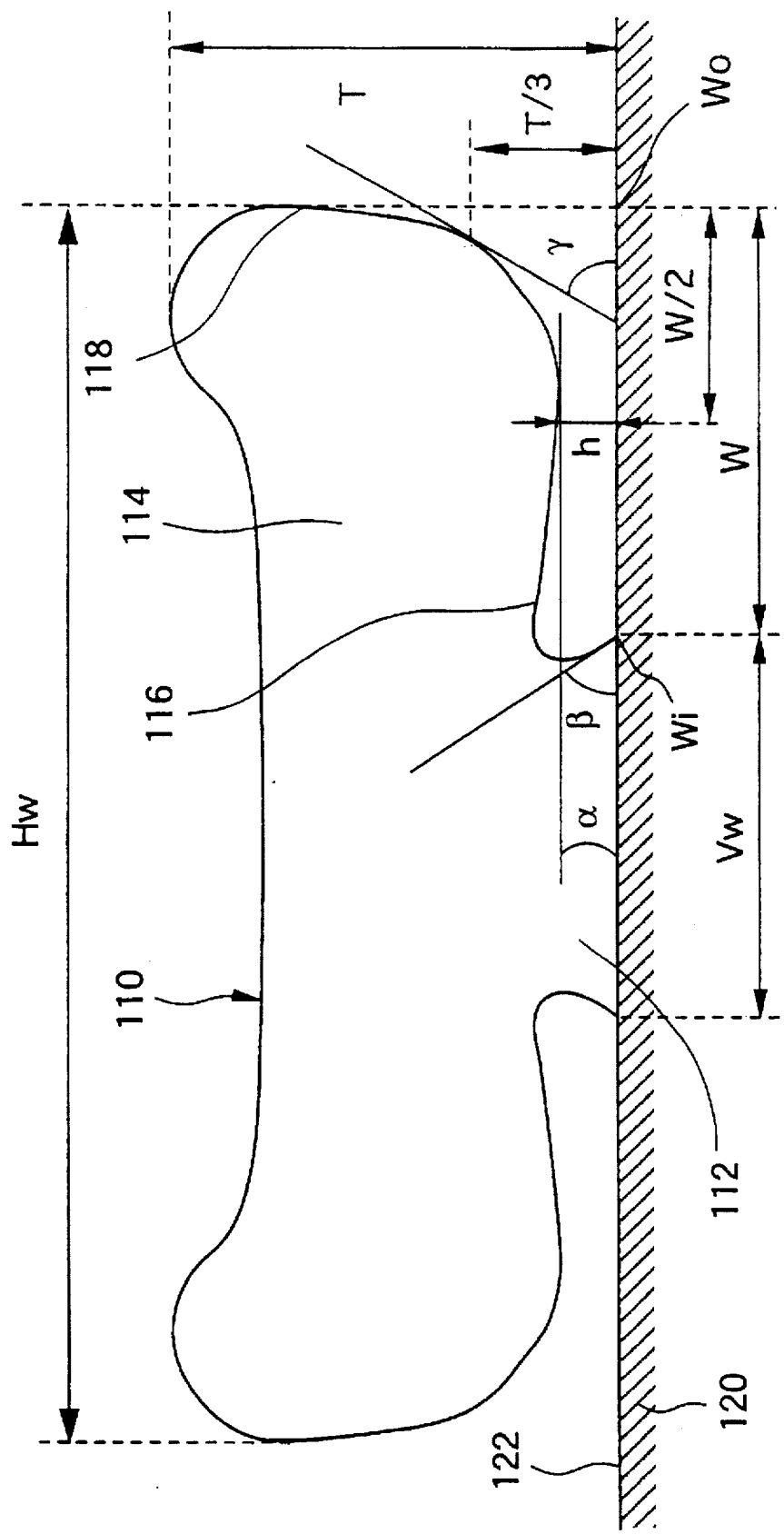
FIG. 1 is a schematic cross sectional view of a resist pattern according to the invention, showing its T-shaped cross section.
Figure 6:
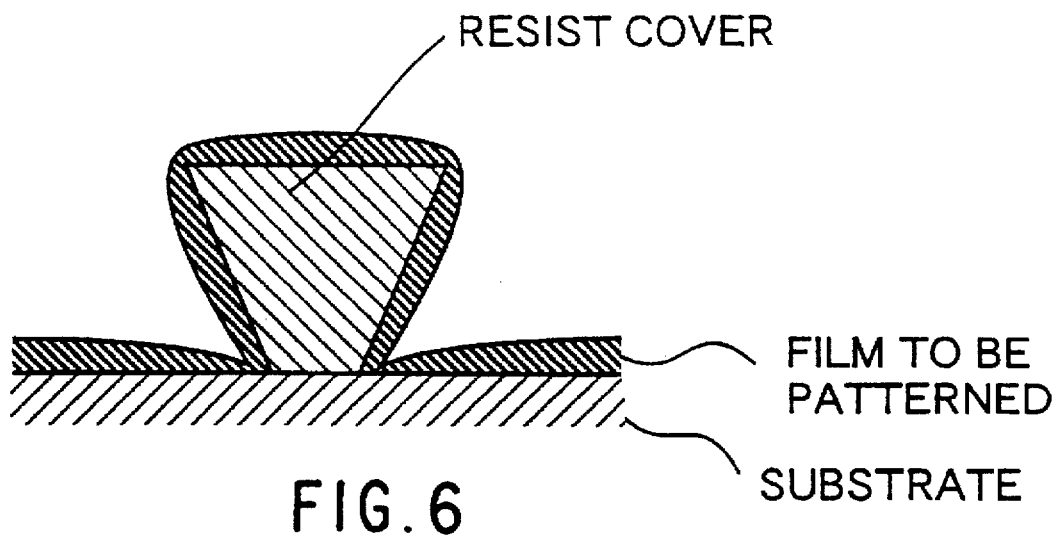
FIG. 6 schematically illustrates the deposition of a film of material to be patterned on a resist pattern of inverted trapezoidal cross section in the lift-off process.
Figure 7:
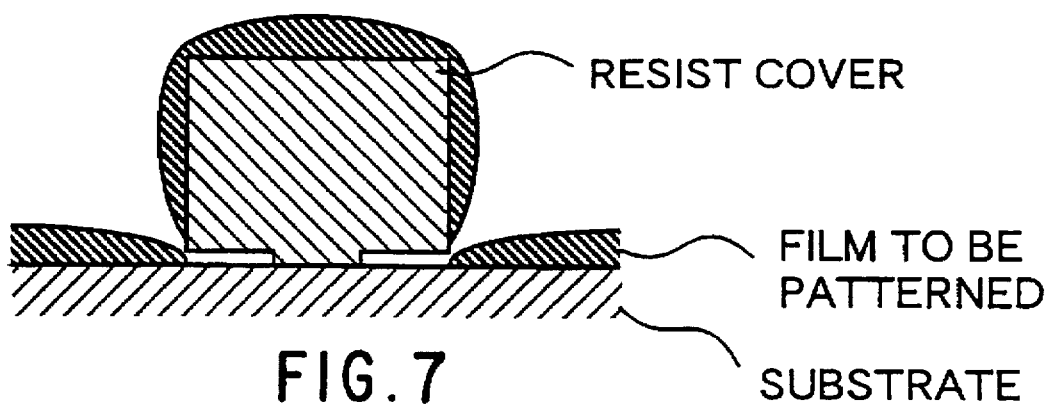
FIG. 7 schematically illustrates the deposition of a film of material to be patterned on a resist pattern of T-shaped cross section in the lift-off process.
Figure 8A:
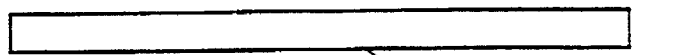
FIG. 8 illustrates steps of a combined milling/lift-off process.
Figure 8B:
Figure 8C:
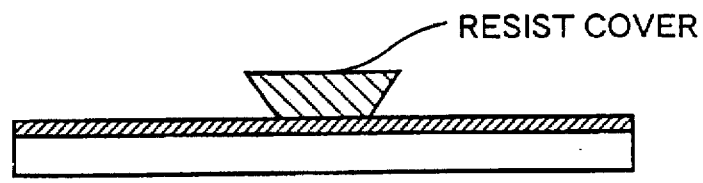
Figure 8D:
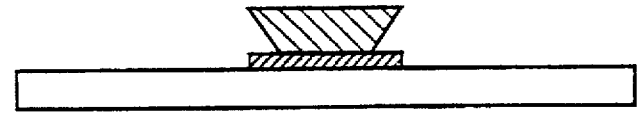
Figure 8E:
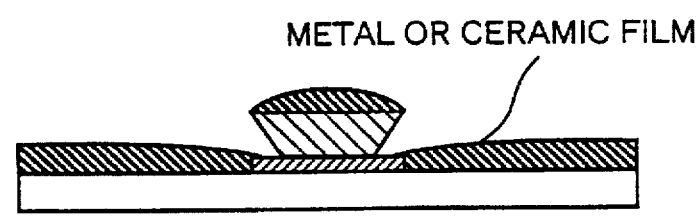
Figure 8F:

According to the invention, a resist pattern is formed on a surface of a substrate by patterning an image reversal type positive resist by a process to be described later. The resist pattern is substantially homogeneous since it is obtained by patterning a single layer of resist.

The image reversal type positive resist is obtained from a resist composition comprising a positive resist compound as a base and a negative working agent added thereto for imparting an image reversal function. When the resist is patterned by a series of steps: imagewise exposure→heating (reversal baking)→uniform exposure (flood exposure) →development, an imagewise exposed area is left as in the case of negative resist.

The resist composition used herein is an image reversal type positive resist composition comprising a positive resist compound comprising a mixture of an alkali soluble phenol resin and a naphthoquinonediazide as a base and a negative working agent added thereto.

The alkali soluble phenol resin used herein includes phenol formaldehyde novolak resins and cresol formaldehyde novolak resins.

The naphthoquinonediazide is a compound having at least one naphthoquinonediazide group which enhances its solubility in basic solution upon exposure to actinic radiation. Compounds of various structures are known although esters of certain hydroxyl compounds with o-benzoquinonediazide and o-naphthoquinonediazide sulfonic acids are preferred. Examples include 2,2'-dihydroxy-diphenyl-bis-(naphthoquinone-1,2-diazide-5-sulfonic acid ester), 2,2',4, 4'-tetrahydroxydiphenyl-tetra(naphthoquinone-1,2-diazide-5-sulfonic acid ester), and 2,3,4-trioxy-benzophenone-bis (naphthoquinone-1,2-diazide-5-sulfonic acid ester). Especially preferred are esters of naphthoquinone-1,2-diazide-5-sulfonic acid with polyhydroxyphenyl resulting from polycondensation of acetone and pyrogallol as disclosed in Japanese Patent Publication No. 25403/1968.

Examples of the negative working agent include amines, aromatic hydrocarbons having a hydroxyl group, 1-hydroxyethyl-2-alkylimidazolines, and shellac.

The amines used as the negative working agent include dialkylamines, trialkylamines, secondary or tertiary amines having a hydroxyalkyl group (to be referred to as hydroxyalkylamines, hereinafter), dialkylamino aromatic hydrocarbons, and cyclic polyamines. Examples of the dialkylamine include diamylamine, diheptylamine and didecylamine; examples of the trialkylamine include tributylamine, triamylamine, trihexylamine and triisoamylamine; examples of the hydroxyalkylamine include diethanolamine, N-methylethanolamine, N-methyldiethanolamine, dipropanolamine, and triethanolamine; examples of the dialkylamino aromatic hydrocarbon include diethylaniline and dipropylaniline; and examples of the cyclic polyamine include hexamethylenetetramine.

The aromatic hydrocarbon having a hydroxyl group includes aromatic hydrocarbons having at least one hydroxyl group capable of forming an ester or ether, for example, resins containing a benzene ring having a hydroxyl group and hydroxybenzene compounds. Examples of the resin containing a benzene ring having a hydroxyl group include phenolformaldehyde novolak resins and cresolformaldehyde novolak resins. Examples of the hydroxybenzene compound include pyrogallol, fluoroglucinol, and 2,2-bis(4-hydroxyphenyl)propane. Exemplary 1-hydroxyethyl-2-alkylimidazolines are those having an alkyl group of 7 to 17 carbon atoms and mixtures thereof.

Preferred as the negative working agent are triethanolamine, N-methylethanolamine, N-methyldiethanolamine, diethylaniline, hexamethylenetetramine, tributylamine, triisoamylamine, meta-cresolformaldehyde resins, shellac, and 1-hydroxyethyl-2-alkylimidazolines.

The amount of the negative working agent used per 100 parts by weight of the resist compound is about 0.005 to about 1 part by weight, preferably about 0.01 to about 0.3 part by weight of amine; about 0.005 to about 10 parts by weight, preferably about 0.01 to about 3 parts by weight of aromatic hydrocarbon having a hydroxyl group or shellac; or about 0.005 to about 0.1 part by weight, preferably about 0.01 to about 0.07 part by weight of 1-hydroxyethyl-2-alkylimidazoline.

In addition to the above-mentioned components, the photosensitive resin composition used herein may contain various additives. For example, resins capable of uniformly mixing with the above-mentioned components may be added for enhancing image intensity or as a binder. Exemplary resins are styrene-maleic anhydride copolymers, styrene-acrylic acid copolymers, and methacrylic acid-methyl methacrylate copolymers.

For the resist composition of this type, reference is made to JP-B 32088/1980, British Patent No. 844,039, and U.S. Pat. No. 4,104,070.

Referring to FIG. 1, the cross-sectional shape of the resist pattern according to the invention is described. The resist pattern generally designated at 110 has a mushroom or T-shaped cross section including a stem portion 112 extending from a surface 122 of a substrate 120 and substantially constituting the vertical bar of T and a cap portion 114 extending from the stem portion 112 in opposite directions, opposed to the substrate surface 122 with a spacing and substantially constituting the horizontal bar of T.

In the cross-sectional shape of FIG. 1, a tangent at the lower edge 116 of the cap portion 114 opposed to the substrate surface 122 forms an angle with the substrate surface 122. A minimum of this angle is designated by α. A line extending from the outermost edge 118 of the cap portion 114 perpendicular to the substrate surface 122 intersects with the substrate surface 122 at a point Wo. The side edge of the stem portion 112 intersects with the substrate surface 122 at a point Wi. The spacing between the (downward facing) lower edge 116 of the cap portion 114 and the substrate surface 122 at an intermediate position between the points Wo and Wi is designated by h. Note that the intermediate position is located at a distance of W/2 from point Wo wherein W is the distance between Wo and Wi.

Figure 9:
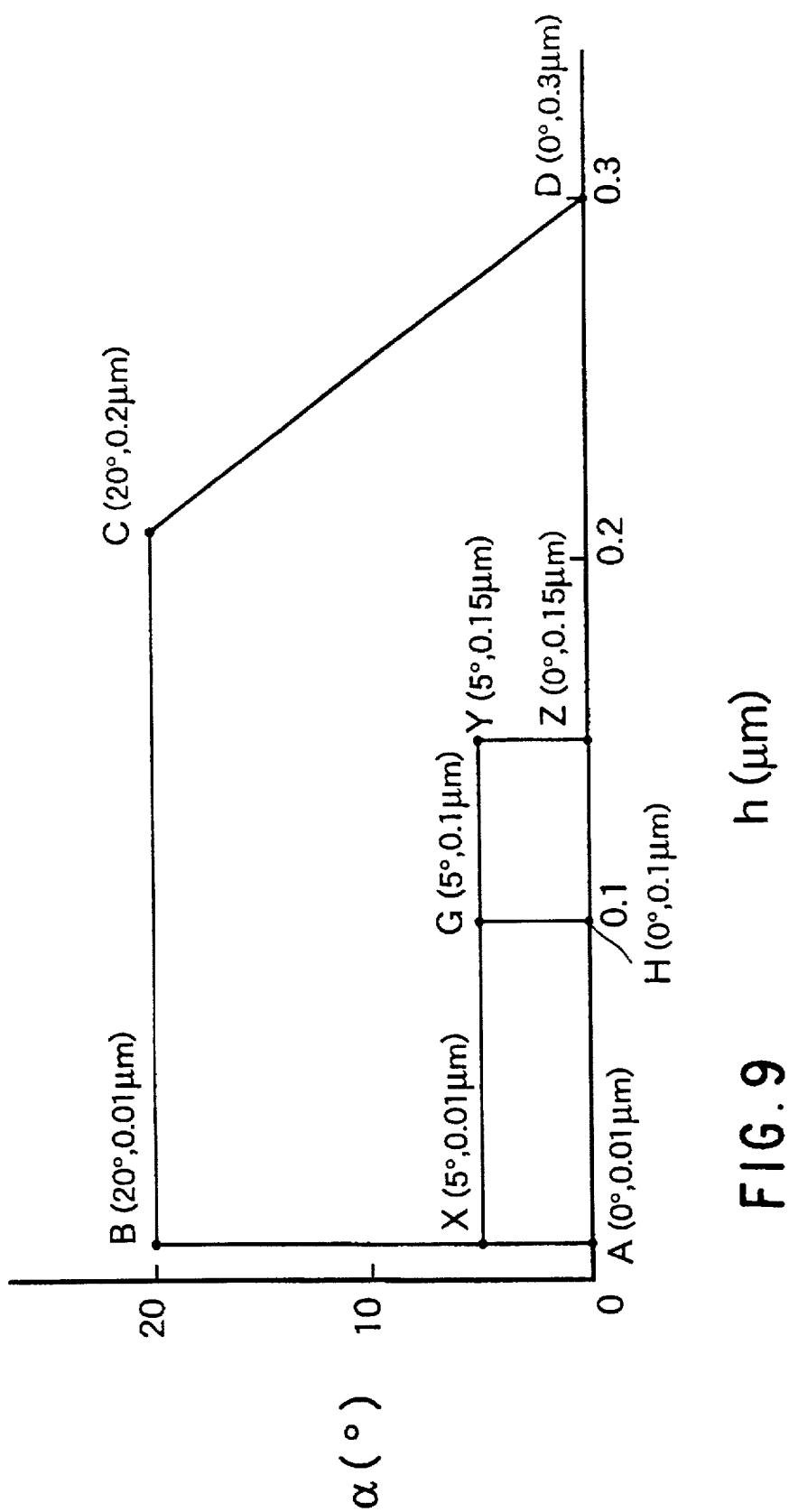
FIG. 9 is a graph showing the range of parameters α and h associated with the resist pattern of the invention.

According to the feature of the invention, the minimum angle α and the spacing h fall within a range defined and encompassed by tetragon ABCD as shown in the h-α graph of FIG. 9 wherein A: α=0°, h=0.01 μm, B: α=20°, h=0.01 μm, C: α=20°, h=0.2 μm, and D: α=0°, h=0.3 μm.

Preferably, α and h fall within a range defined and encompassed by tetragon AXYZ in the h-α graph wherein A: α=0°, h=0.01 μm, X: α=5°, h=0.01 μm, Y: α=5°, h=0.15 μm, and Z: α=0°, h=0.15 μm, More preferably, α and h fall within a range defined and encompassed by tetragon AXGH in the h-α graph wherein A: α=0°, h=0.01 μm, X: α=5°, h=0.01 μm, G: α=5°, h=0.1 μm, and H: α=0°, h=0.1 μm.

In a resist pattern of T-shaped cross section, the setting of α and h within the range of tetragon ABCD allows for effective lift-off and ion milling, ensuring a rejection rate of less than 20%. A resist pattern of such definite T-shaped cross section formed from a single layer of resist has never been available in the art. It is noted that α=0° means that the tangent at the lower edge 116 of the cap portion 114 is parallel to the substrate surface 122.

In FIG. 1, the distance W between points Wo and Wi is preferably 0.03 to 3 μm, more preferably 0.1 to 3 μm, most preferably 0.2 to 1 μm. The rejection rate is further reduced by setting W within this range.

Other parameters associated with the resist pattern with T-shaped cross section according to the invention are described below.

The resist pattern 110 has a height T from the substrate surface 122, which is preferably 0.3 to 3 μm, more preferably 0.4 to 2 μm, most preferably 0.4 to 1 μm. With a height T outside the range, it is sometimes difficult to define a T-shaped cross section. With a height T below the range, the pattern would be useless as a resist cover. When a pattern having a height T beyond the range is used as a resist cover during milling, the milled pattern is undesirably beveled at its end, approaching parallel to the substrate surface.

Further in FIG. 1, a line extending from point Wi tangent to the side edge of the stem portion 112 and upward from the substrate forms an angle β with a line extending parallel to the substrate surface 122 and inward of the stem portion 112. The angle β is preferably 10° to 160°, more preferably 70° to 110°.

Furthermore, a line extending from the substrate surface 122 and tangent to the side edge (118) of the cap portion 114 at a height of T/3 from the substrate surface 122 forms an angle γ with a line extending parallel to the substrate surface 122 and away from the stem portion 112. The angle γ is preferably 20° to 120°, more preferably 60° to 100°, most preferably 80° to 90°.

Moreover, the cap portion 114 in FIG. 1 has a maximum width Hw which is preferably 0.1 to 7 μm, more preferably 0.3 to 3 μm as measured parallel to the substrate surface 122.

Additionally, the stem portion has a width Vw adjacent to the substrate surface 122 wherein Vw/Hw is preferably from 0.1 to 0.995, more preferably 0.15 to 0.95.

It is noted that the resist pattern 110 with T-shaped cross section generally has a concave top surface. The top surface can be flat or convex when the width Hw is small.

In the disclosure, the term "substrate surface" is a surface of a substrate to which the stem portion of the resist pattern is located contiguous. Where a resist pattern is formed on a surface of a film to be milled, for example, the surface of that film to be milled is the substrate surface.

For the substrate surface on which the resist pattern with T-shaped cross section is formed, metal materials and ceramic materials are preferably used. Preferred examples of the metal material used herein include metals such as Cr, Al, W, Te, Mo, Fe, Ni, Co, Mn, Ti, Ta, Au, Ag, and Cu and alloys such as Fe-Ni, Ni-Mn, Fe-Ni-Co, and Fe-Co alloys. Preferred examples of the ceramic material used herein include metal oxides such as NiO, $Al_2O_3$, and $ZrO_2$, composite metal oxides such as $LiNbO_2$, $LiTaO_3$, and ferrite, and carbides such as AlTiC. The crystallinity of these materials is not critical.

On a substrate having a surface of any of the above-mentioned materials, a resist pattern having a characteristic cross-sectional configuration can be formed. It is noted that the present invention excludes the use of silicon single crystal substrates which are commonly used in the manufacture of semiconductor devices. We empirically found that when the above-mentioned resist composition was applied to a silicon single crystal substrate, a resist pattern having a characteristic cross-sectional configuration could not be formed. The present invention also excludes the use of a substrate whose surface is composed of silicon oxide, typically $SiO_2$ because a desired resist pattern can not be formed as in the case of silicon substrates.

Next, the method for forming a resist pattern of a T-shaped cross section is described.

Figure 11A:
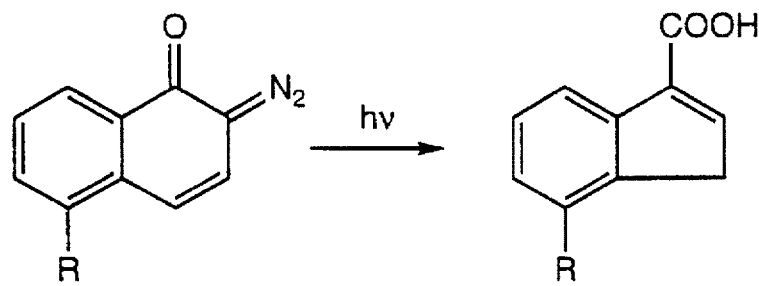
FIG. 11 illustrates exemplary chemical reactions which take place in the image reversal positive resist during its patterning.
Figure 11B:
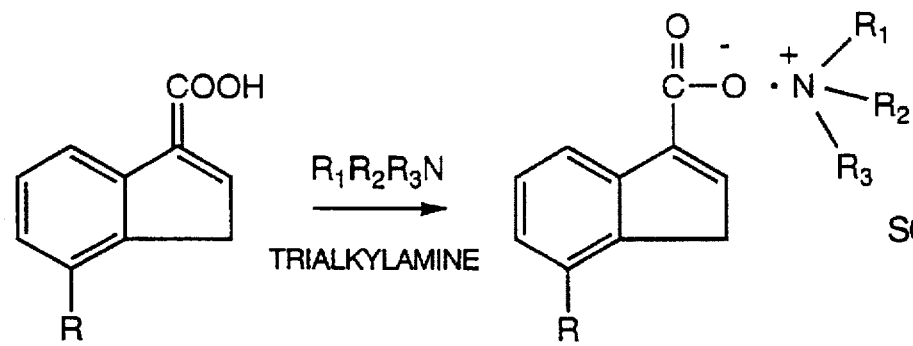
Figure 11C:
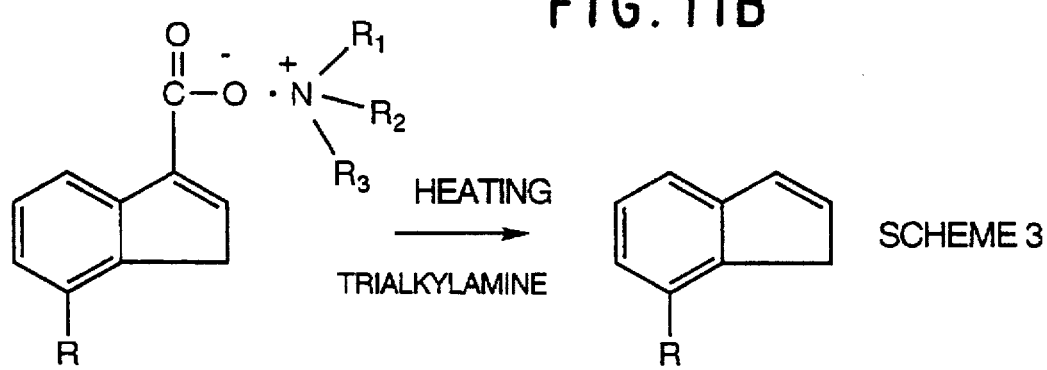

FIG. 10 illustrates a process for patterning an image reversal type positive resist. FIG. 11 illustrates chemical reactions which take place in the resist during the patterning process. Stages of the process for patterning an image reversal type positive resist are described. For detail, reference is made to M. Spacet al., "Mechanism and lithographic evaluation of image reversal in AZ5214 photoresist," Proc. of conference on photopolymers principle processing and materials, Ellenville (1985). The following description refers to the use of a basic amine as a negative working agent.

Stage 1: Exposure

In stage 1, an image reversal type positive resist composition 2 is coated onto an upper surface of a substrate 1 as shown in FIG. 10. After prebaking, the resist film on the upper surface is exposed to UV radiation A (wavelength 300 to 500 nm) through a mask 3 having a predetermined pattern. The resist film now includes an exposed area 4 and an unexposed area 5. In the exposed resist area 4, diazonaphthoquinone undergoes Wolf rearrangement into indenecarboxylic acid (see Scheme 1 in FIG. 11). The indenecarboxylic acid undergoes acid-alkali reaction with the basic amine used as a negative working agent into a somewhat unstable amine salt of carboxylic acid (see Scheme 2 in FIG. 11.

Stage 2: Reversal Baking

After the reaction of Scheme 2, the resist is heated at 90° to 130° C. for reversal baking (RB). With this heating, the amine salt of carboxylic acid quickly converts into an indene insoluble in aqueous base through carbonyl-removal reaction (see Scheme 3 in FIG. 11). The indene is not only insoluble in aqueous base, but inert to subsequent UV irradiation and heat. Since this reversal baking step corresponds to post-baking in a conventional process, the instant process eliminates a need for post-baking.

Stage 3: Flood Exposure

In stage 3, the resist is exposed to UV radiation B. In the unexposed portion 5 of the resist which has been shielded during the first exposure, diazonaphthoquinone as a photosensitive group converts into indenecarboxylic acid soluble in aqueous base (see Scheme 1 in FIG. 11). Subsequent reaction with basic amine yields an amine salt of carboxylic acid (see Scheme 2 in FIG. 11). This amine salt of carboxylic acid is also soluble in aqueous base. Since the UV radiation B does not participate in pattern formation, its wavelength is not critical and may be the same as the wavelength of UV radiation A. Although flood exposure is not always needed, a developer having a relatively high concentration must be used and scum can generate during development if flood exposure is omitted.

Stage 4: Development

Finally, the resist is developed with aqueous base whereupon the unexposed area 5 is dissolved away and the exposed area 4 is left. Patterning of the resist film is completed in this way.

Commercially available products of image reversal type positive resist are Resist AZ5200E series from Hoechst. The detail of this resist is described in M. Bolzen, "Submicron processing technology by image reversal of positive photoresists," Densi-Zairyo (Electronic Material), 6, 1 (1986).

Figure 12:
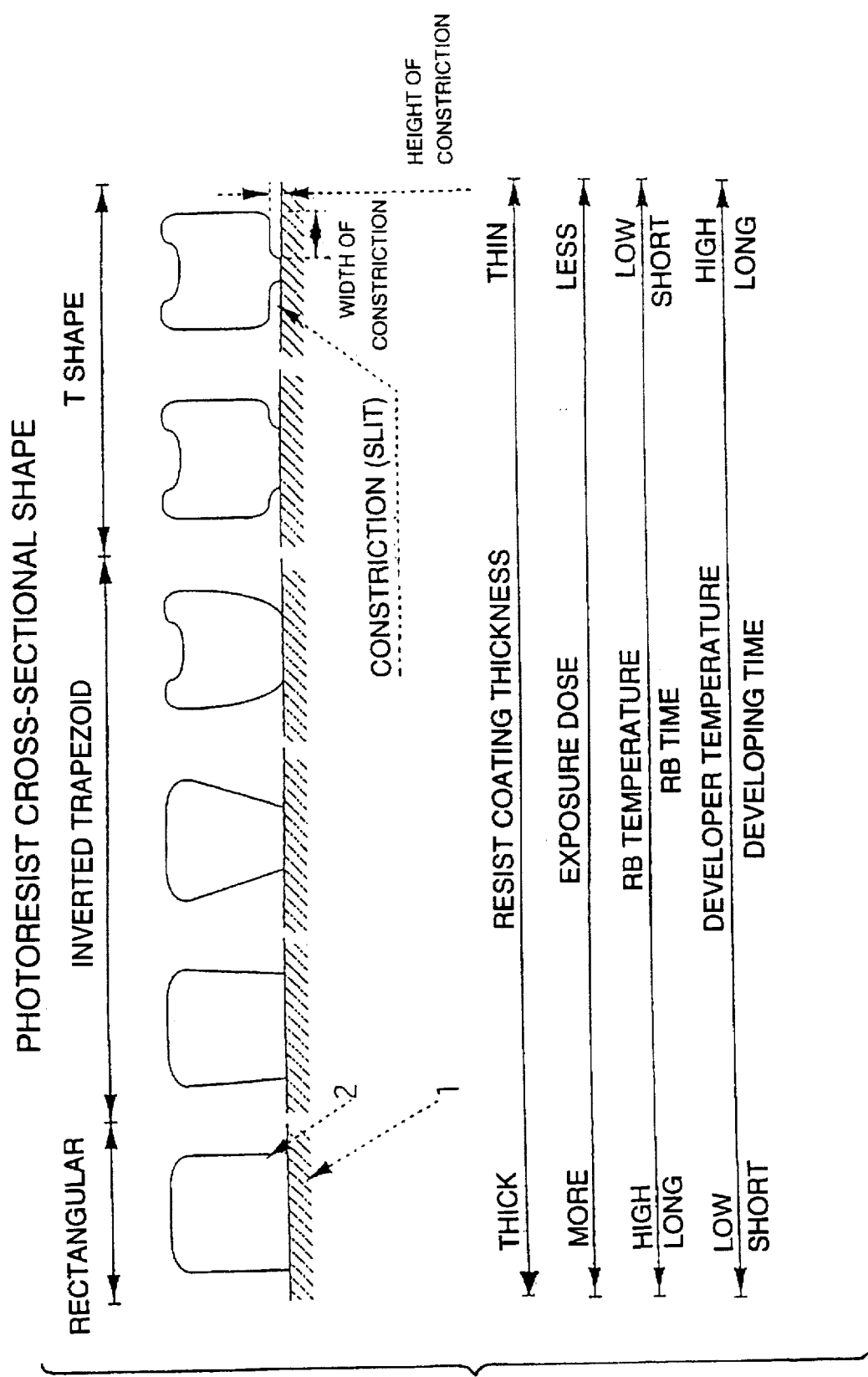
FIG. 12 shows how the cross-sectional shape of image reversal type positive resist is affected by each of conditions of each step during patterning of the resist provided that the remaining conditions are the same.

Now referring to FIG. 12, it is described how one of conditions in each stage of the process for patterning an image reversal type positive resist affects the cross-sectional configuration of resist, provided that the remaining conditions are the same.

(1) Substrate surface

The relation of the resist's cross-sectional configuration to patterning conditions does not depend on the type of substrate and whether or not the substrate surface is treated (as by HMDS gas phase treatment). It is preferred to omit surface treatment.

(2) Resist coating thickness, pre-baking temperature and time

As the thickness of a resist coating is reduced, the portion of an inverted trapezoidal resist shape which is in contact with the substrate is constricted or formed with a slit (into a neck shape) and this slit becomes wider so that the cross section changes from an inverted trapezoid to a T shape. Preferably the resist coating has a thickness of 3 μm or less after pre-baking. The lower limit of the resist coating thickness is preferably about 0.3 to 0.5 μm. The pre-baking temperature and time have little influence on the cross-sectional configuration of resist. Temperatures below the reversal baking temperature are preferred.

(3) Exposure dose

As the dose of exposure is reduced, the portion of an inverted trapezoidal resist shape which is in contact with the substrate is constricted or formed with a slit (into a neck shape) and the cross section changes from an inverted trapezoid to a T shape. Although the optimum dose varies with the type of optical aligner and the wavelength distribution of light to be irradiated (including UV, excimer and other laser light, X-ray, and electron beam), a dose of 10 to 500 mJ/cm$^2$ is preferred based on our experimentation. More particularly, the dose is preferably 100 to 500 mJ/Cm$^2$, more preferably 100 to 400 mJ/cm$^2$, most preferably 100 to 330 mJ/cm$^2$ when broad band light with i-line (wavelength 365 nm) cut or g-line (wavelength 436 nm) is used. The dose is preferably 10 to 100 mJ/cm$^2$, more preferably 30 to 60 mJ/cm$^2$ when i-line (wavelength 365 nm) is used. It is noted that in the manufacture of a magnetoresistance (MR) thin film element, i-line or radiation of shorter wavelength or electron beams are preferably used as the exposure light in order to provide an MR film with a fine pattern. None of the fine resist patterns which were heretofore produced through i-line exposure by prior art techniques had a satisfactory T-shaped cross section.

Also the height of a slit or constriction formed in that portion of a resist pattern contiguous to the substrate can be adjusted by controlling the focal point of exposure light. More particularly, as the focal point is shifted from the resist coating surface toward the substrate (this is expressed with a negative (−) sign), the height of a constriction or slit is reduced. As the focal point is shifted from the resist coating surface in a direction opposite to the substrate (this is expressed with a positive (+) sign), the height of a constriction or slit is increased. Preferably the focal point is located in the range of −1 μm to +10 μm, especially −1 μm to +6 μm with respect to the resist coating surface. By locating the focal point within this range, the spacing h within the range of the invention is readily accomplished.

(4) Reversal baking (PUB) temperature and time

As the RB temperature is lowered, the junction of an inverted trapezoidal resist to the substrate is constricted or formed with a slit (into a neck shape) and this slit becomes wider so that the cross section changes from an inverted trapezoid to a T shape. The RB temperature is preferably 100° to 123° C., especially 100° to 118° C. As the RB time is reduced (but longer than a necessary time), the tendency that the junction of an inverted trapezoidal resist to the substrate is constricted or formed with a slit (into a neck shape) and the cross section changes from an inverted trapezoid to a T shape is enhanced. The RB time is preferably 30 seconds to 13 minutes. Reaction as shown in FIG. 11 would not take place if the RB time is too short.

(5) Flood exposure dose

The dose of flood exposure has little influence on the cross-sectional configuration of resist. Typically the dose of flood exposure is 100 to 600 mJ/cm$^2$.

(6) Development and rinse conditions

The developer which is an aqueous alkaline solution has little influence on the cross-sectional configuration of resist. For example, aqueous solutions of phosphates and tetramethylammonium hydroxide (TMAH) are useful. As the developing temperature is higher and/or as the developing time is longer, the junction of an inverted trapezoidal resist to the substrate is constricted or formed with a slit (into a neck shape) and this slit becomes wider so that the cross section changes from an inverted trapezoid to a T shape. Preferred developing conditions include 1 to 3% aqueous solution of sodium phosphate (Na$_n$H$_3$-nPO$_4$), room temperature (20°–25° C.), and a time of 30 to 90 seconds. Independent of temperature and time, the rinse which is deionized water has little influence on the cross-sectional configuration of resist. Preferred rinsing conditions include ultra-deionized water, room temperature (20°–25° C.), and a time of 10 to 180 seconds.

(7) Baking after development

A baking step may be incorporated for drying after development. Conditions of baking after development have little influence on the cross-sectional configuration of resist.

As mentioned above, in a process for patterning an image reversal type positive resist, a resist pattern of T-shaped cross section is obtained when conditions of respective steps are properly combined. More particularly, for a particular combination of reversal baking conditions and developing conditions, for example, a resist pattern of T-shaped cross section is obtained when a resist is exposed in a dose less than the minimum dose with which a resist has an inverted trapezoidal cross section. For a particular combination of exposing conditions and developing conditions, for example, a resist pattern of T-shaped cross section is obtained when a resist is reversal baked at a temperature lower than the lowest reversal baking temperature at which a resist has an inverted trapezoidal cross section. It is thus understood that control of an exposure dose and reversal baking temperature, especially control of a reversal baking temperature is effective in forming a resist pattern of T-shaped cross section. A desirable T-shaped cross section can also be accomplished by controlling other conditions. These conditions are shown together in FIG. 12.

Using the resist pattern of the invention described so far, a magnetoresistance thin film element can be manufactured.

Figure 13:
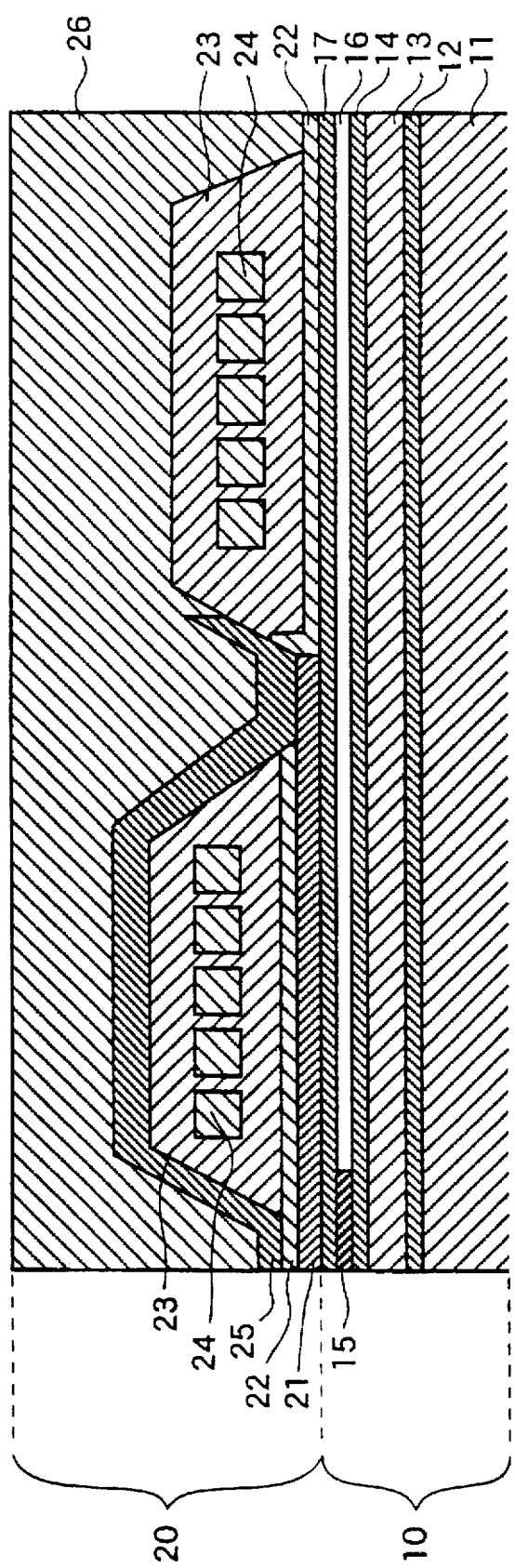
FIG. 13 is a cross-sectional view of the multilayer structure of a magnetoresistance thin film head prepared using the resist pattern of the invention.

FIG. 13 illustrates one exemplary layer structure of a hybrid thin film magnetic head comprising a magnetoresistance thin film read head which is one embodiment of the magnetoresistance thin film element of the invention and an inductive thin film write head. The magnetoresistance thin film read head 10 includes a substrate 11, an insulating film 12, a lower shield layer 13, an insulating film 14, a magnetoresistance (MR) film 15, an MR lead layer 16 (that is, an electrode film for the MR film), and an insulating film 17. The inductive thin film write head 20 includes a lower magnetic pole 21, an insulating film 22, an insulating film 23, a coil 24, an upper magnetic pole 25, and a protective layer 26. The magnetoresistance thin film read head 10 is combined with the inductive thin film write head 20 to form the hybrid head.

In the hybrid head, the substrate 11 used is generally of ceramic material such as AlTiC. The insulating film 12 is preferably formed of Al$_2$O$_3$, SiO$_2$, etc. and has a thickness of about 1 to 20 µm. The lower shield layer 13 is preferably formed of FeAlSi, NiFe, CoFe, CoFeNi, FeN, FeZrN, FeTaN, CoZrNb, CoZrTa, etc. and has a thickness of about 0.1 to 5 µm, especially 0.5 to 3 µm. The insulating film 14 is preferably formed of Al$_2$O$_3$, SiO$_2$, etc. and has a thickness of about 100 to 2,000 Å.

The magnetoresistance film 15 may be a single magnetic layer although it is preferably of a multilayer structure having superposed magnetic layers and nonmagnetic layers. The magnetic layers are preferably formed of NiFe, NiFeRh, FeMn, NiMn, Co, Fe, NiO, NiFeCr, etc. The nonmagnetic layers are preferably formed of Ta, Cu, Ag, etc. The multilayer structure may be a three-layer structure of NiFeRh/Ta/NiFe or a structure having recurring multilayer units of, for example, NiFe/Cu/NiFe/FeMn, NiFe/Cu/Co/FeMn, Cu/Co/Cu/NiFe, Fe/Cr, Co/Cu or Co/Ag. In the multilayer structure, the magnetic layers preferably have a thickness of about 5 to 500 Å, especially about 10 to 250 Å and the nonmagnetic layers preferably have a thickness of about 5 to 500 Å, especially about 10 to 250 Å. The number of recurring units is preferably 1 to 30, especially 1 to 20. The magnetoresistance film preferably has an overall thickness of about 50 to 1,000 Å, especially about 100 to 600 Å.

The MR lead layer 16 is preferably formed of W, Cu, Au, Ag, Ta, Mo, CoPt, etc. and has a thickness of about 100 to 5,000 Å, especially 500 to 3,000 Å. The insulating film 17 is preferably formed of Al$_2$O$_3$, SiO$_2$, etc. and has a thickness of about 50 to 5,000 Å, especially about 100 to 2,000 Å.

Among the constituent layers of the MR thin film head, the insulating films 12, 14, 17, MR film 15, and MR lead layer 16 may be formed by either the lift-off method or milling patterning method using a resist pattern of the present invention. The lower shield layer 13 of substantial thickness may be formed by the milling patterning method using a resist pattern of the present invention. When the MR film 15 andMR lead layer 16 are formed as continuous layers, they may be formed by the combined lift-off/milling patterning method using a resist pattern of the present invention.

Using the resist pattern of the invention, a magnetoresistance thin film head can be effectively manufactured in high yields.

EXAMPLE

Examples of the present invention are given below by way of illustration and not by way of limitation.

In the following examples, Resist AZ5214E was used as an image reversal type positive resist. Resist AZ5214E is a resist composition comprising a positive resist compound containing a mixture of an alkali soluble phenol resin and a naphthoquinonediazide, a basic amine added as a negative working agent, and propylene glycol monomethyl ether acetate as a primary solvent and having a solid content of 28.3%.

Example 1

Resist patterns designated sample Nos. 1 to 8 were formed under the conditions shown in Table 1 while the exposure dose, focal point, and RB temperature were changed for each sample as shown in Table 2. For each sample, 1,000 specimen were prepared so as to fall in the range of every parameter.

TABLE 1

| | |
|---|---|
| Substrate: | AlTiC having an Al$_2$O$_3$ surface layer |
| Substrate surface treatment: | none |
| Resist: | AZ5214E by Hoechst |
| Resist coating thickness: | ~1.8 µm as pre-baked |
| Pre-baking temperature/time: | 95° C., 6 min. (direct hot plate) |
| Aligner: | stepper Ultrastep Model 1500 by Ultratech, NA = 0.28, focus (see Table 2), UV: broad |
| Exposure dose: | (i-line cut) see Table 2 (mask width: 2.0 µm) |
| RB temperature: | see Table 2 (hot plate) |
| RB time: | 5 min. |
| Flood aligner: | parallel light aligner model PLA-501F by Canon K.K. |
| Flood exposure dose: | 500 mJ/cm$^2$ |
| Developer, temp., time: | Micro Posit Developer (:H$_2$O = 1:1) by Shipley Co., Inc., 23° C., 70 sec. (paddle, contacted with a pool of developer for development) |

TABLE 1-continued

| | |
|---|---|
| Rinse, temp., time: | ultra-deionized water, 23° C., 60 sec. (paddle) |
| Baking after development: | none |

TABLE 2

| Sample No. | Dose (mJ/cm$^2$) | Focus (μm) | RB temp. (°C.) | α (°) | h (μm) | Rate of rejection** |
|---|---|---|---|---|---|---|
| 1* | 100 to 330 | −10 to <−4 | 100 to <118 | 0 to <5 | 0 to <0.01 | ≧40% |
| 2 | 100 to 330 | −4 to <−1 | 100 to <118 | 0 to <5 | 0.01 to <0.03 | 20 to <40% |
| 3 | 100 to 330 | −1 to <+6 | 100 to <118 | 0 to <5 | 0.03 to 0.1 | <10% |
| 4 | 100 to 330 | +6 to +10 | 100 to <118 | 0 to <5 | >0.1 to 0.2 | 10 to <20% |
| 5* | 100 to 330 | >+10 | 100 to <118 | >2.5 to <5 | >0.3 | ≧40% |
| 6 | 330 to 400 | −1 to <+6 | 118 to <123 | >5 to 20 | 0.03 to 0.1 | 10 to <20% |
| 7 | 330 to 400 | +6 to +10 | 118 to <123 | >5 to 20 | 0.1 to 0.2 | 10 to <20% |
| 8* | 500 | −10 to <−4 | 130 | >20 | 0 to <0.01 | ≧40% |

*comparison
**calculated from test results of outer appearance and electromagnetic properties These samples were measured for minimum angle α and spacing h defined previously using a field emission electron beam SEM (ULSI high-precision outer dimension rating equipment S-7000 by Hitachi K.K.). The results are also shown in Table 2. Sample No. 3 was measured for W, T, β, γ, Hw, and Vw defined previously, finding W=~0.75 μm, T=~1.8 μm, β=~135°, γ=~90°, Hw=~2.4 μm, and Vw/Hw= ~0.3. Other samples were similarly measured to find equivalent results.

Figure 14:
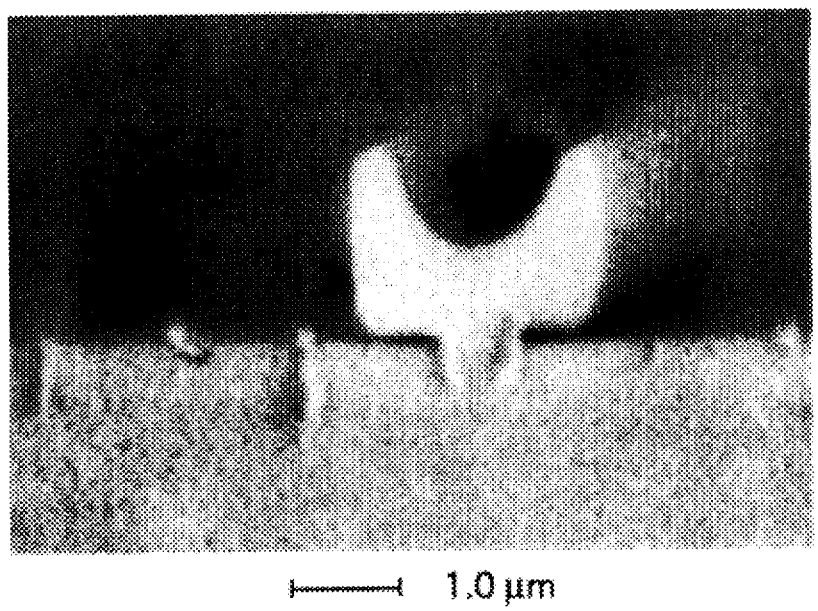
FIG. 14 is a SEM photomicrograph showing the cross section of a resist pattern designated sample No. 3.

FIG. 14 is a photomicrograph through the above-mentioned SEM of the cross-sectional configuration of Sample No. 3 resist pattern. It is seen that a resist pattern of T-shaped cross section with a satisfactory contrast was obtained. The resist pattern shown in FIG. 14 was formed on a silicon substrate surface coated with an Al$_2$O$_3$ layer which was easy to cut.

These samples were formed on a metal oxide Al$_2$O$_3$. (The substrate surface was Al$_2$O$_3$ although the substrate itself was AlTiC.) Values of α and h equivalent to those shown in Table 2 were obtained when resist patterns were formed as in Sample No. 3 except that metals such as Ni, Cr, and Ta, alloys such as Fe-Ni and Fe-Ni-Co, and composite metal oxides such as LiNbO$_3$ were used as the substrate surface. The resulting resist patterns had a T-shaped cross section and a satisfactory contrast.

The following experiment was carried out in order to examine the milling patterning performance of the resist pattern samples. On a surface of a substrate wherein the substrate itself was AlTiC and surface covered with an Al$_2$O$_3$ coating, NiFe was uniformly deposited by sputtering to a thickness of 0.06 μm. By the lift-off method (conditions are shown below), milling patterning method (ion milling conditions are shown below), and combined method (conditions are shown below) using the resist patterns of sample Nos. 1 to 8, magnetoresistance thin film magnetic heads of the layer structure shown in FIG. 13 were prepared, 1,000 heads for each of the samples.

Lift-off Conditions

Organic solvent: acetone
Dipping time: 30 min.

Ion Milling Conditions

Type of ion: Ar$^+$
Gas pressure: 1.5×10$^{-1}$ Torr
Accelerating voltage: 300 V
Accelerating current: 250 mA
Milling angle: 90° (relative to the substrate surface)
Time: 8 min.

Combined Method Conditions

The above-mentioned ion milling conditions and lift-off conditions were used in combination.

The MR thin film magnetic heads were examined for outer appearance and electromagnetic properties, from which a rate of rejection was calculated. The results are also shown in Table 2. It is evident from Table 2 that using inventive samples having α and h within the specific ranges, magnetic heads can be prepared at a very low rate of rejection.

In the manufacture of these magnetic heads, the shield film in the layer structure of FIG. 13 was formed by the milling patterning method, and the continuous film of MR film and electrode film therefor formed by the combined method. Equivalent results were obtained when a MR film was formed by the milling patterning method and an electrode film therefor was formed by the lift-off method.

Example 2

A resist pattern sample was prepared under the conditions shown in Table 3.

TABLE 3

| | |
|---|---|
| Substrate: | Si having an Al$_2$O$_3$ surface layer |
| Substrate surface treatment: | none |
| Resist: | AZ5206E by Hoechst |
| Resist coating thickness: | ~0.7 μm as pre-baked |
| Pre-baking temperature/time: | 95° C., 6 min. (direct hot plate) |
| Aligner: | stepper FPA-3000i4 by Canon K.K., NA = 0.45, ±0.00 μm, UV: i-line |
| Exposure dose: | 50 mJ/cm$^2$ (mask width: 0.55 μm) |
| RB temperature: | 113° C. (hot plate) |
| RB time: | 3 min. |
| Flood aligner: | parallel light aligner model PLA-501F by Canon K.K. |
| Flood exposure dose: | 200 mJ/cm$^2$ |
| Developer, temp., time: | Micro Posit Developer (40% aqueous solution) by Shipley Co., 23° C., 50 sec. (paddle, contacted with a pool of developer for development) |
| Rinse, temp., time: | ultra-deionized water, 23° C., 60 sec. (paddle) |
| Baking after development: | none |

A cross section of this sample was similarly examined by means of SEM, finding α=~0°, h=~0.02 μm, W=~0.26 μm, T=~0.5 μm, β=~80°, γ=~70°, Hw=~0.65 μm, and Vw/Hw= ~0.21.

Figure 15:
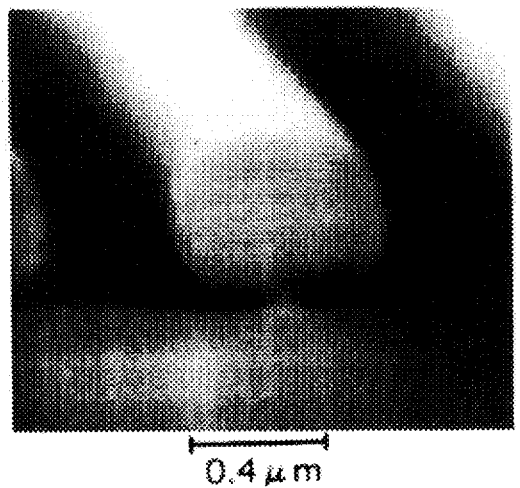
FIG. 15 is a SEM photomicrograph showing the cross section of a fine resist pattern formed on a substrate in Example 2.

FIG. 15 is a SEM photomicrograph of a cross section of this sample.

Figure 16:
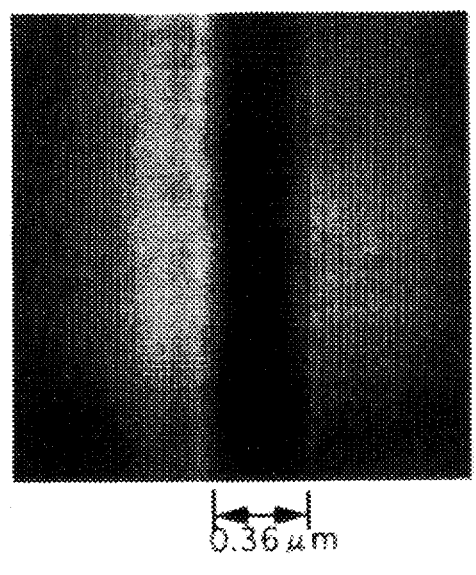
FIG. 16 is a SEM photomicrograh showing a continuous film of an MR film and an MR lead layer formed by a milling and lift-off process using the resist pattern of Example 2.
Figure 17:
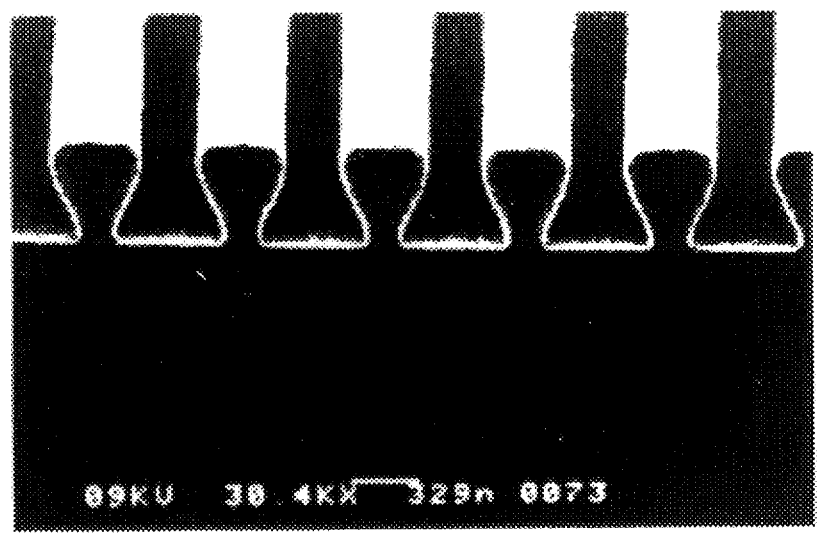
FIGS. 17 to 20 are SEM photomicrographs showing the cross section of a prior art resist pattern on a substrate.
Figure 18:
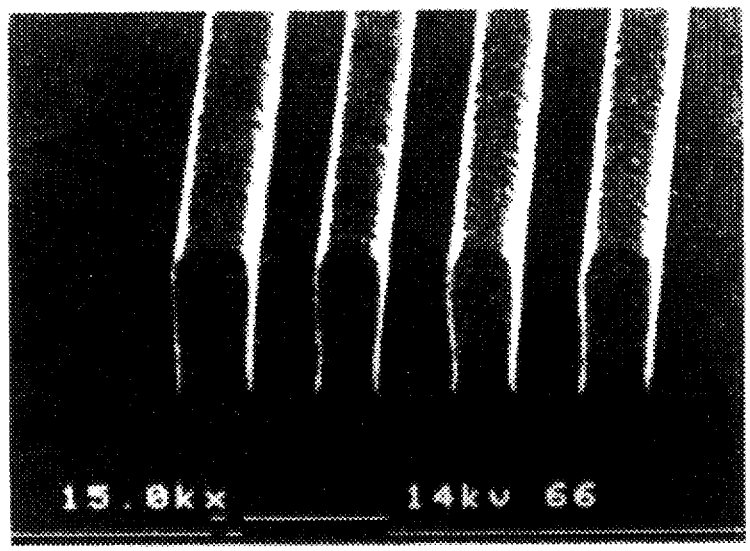
Figure 19:
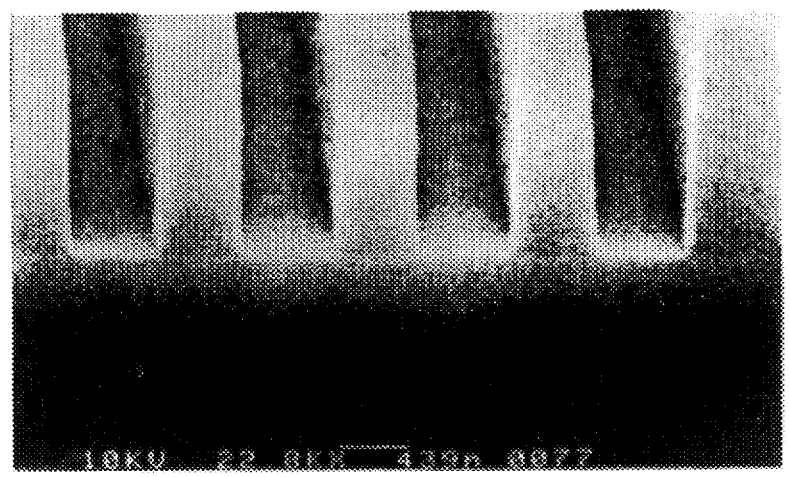
Figure 20:
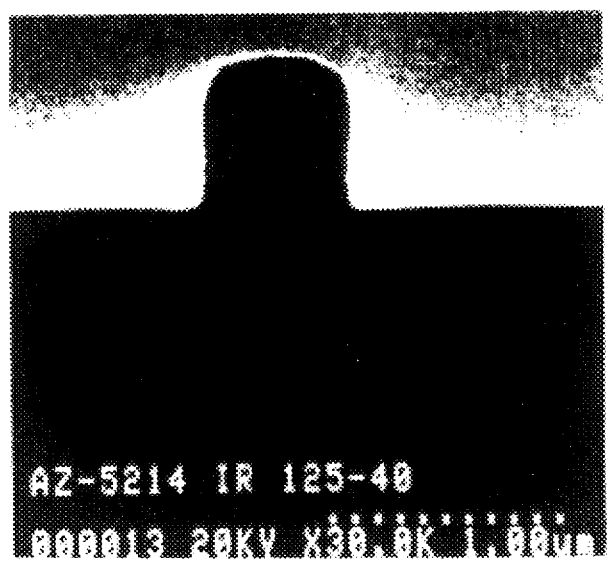

The following experiment was carried out in order to examine the patterning performance of this resist pattern sample. On an $Al_2O_3$ coating surface of an AlTiC substrate, a magnetoresistance film of a multilayer structure was formed by sputtering. The MR film had a composition and thickness of NiFeRh/Ta/NiFe/Ta=130/100/200/50 Å. The resist pattern sample was formed on the MR film as a resist cover. Patterning was carried out by the milling method. With the resist cover kept unchanged, an electrode film for the MR film (that is, MR lead layer) having a multilayer structure was formed by the lift-off method, obtaining a continuous film of the MR film and MR lead layer. The MR lead layer had a composition and thickness of TiW/CoPt/TiW/Ta=100/500/100/1000 Å. An SEM photomicrograph of this continuous film is shown in FIG. 16. In this continuous film, the MR film had a width (corresponding to a track width when applied to a magnetic head) of 0.36 μm.

Thousand MR thin film magnetic heads were similarly prepared to examine a rate of rejection as in Example 1. The rate of rejection was 10% or less. It is thus evident that according to the invention, MR thin film magnetic heads with a narrow track width can be consistently manufactured.

The present invention has the following benefits. (1) By controlling according to the invention conditions in a conventional patterning process which otherwise produces only an inverted trapezoidal cross section, a resist pattern of T-shaped cross section with a high contrast is readily formed using a single layer of resist. (2) The width (Hw in FIG. 1) of the T-shaped cross section, the width (Vw) of the stem portion at the joint to the substrate, and the width (W) of the constriction or slit to the joint to the substrate, and the height (h) of the constriction can be controlled within a certain range in a reproducible manner. (3) Owing to the benefit mentioned just above, when the resist pattern of T-shaped cross section according to the invention is used as a mask pattern during lifting-off and dry etching, the cross-sectional shape of the mask pattern can be optimized in accordance with the thickness and patterning width of a film to be patterned. The yields of lifting-off and dry etching are increased. (4) A resist pattern of cross section having a width of less than 1 μm can be formed. This enables formation of lift-off and dry etching patterns with a width of less than 1 μm. (5) A resist pattern of T-shaped cross section can be formed even by exposure with UV radiation. The cost of equipment for exposure can be reduced because of an eliminated need for expensive equipment such as an excimer laser. (6) A prior art method was very cumbersome in forming a resist pattern of T-shaped cross section since a plurality of steps of exposure and wet development each requiring mask alignment are involved. According to the invention, since each of exposure and wet development steps can be completed once, the patterning process becomes simple, reducing the processing time. (7) Owing to benefits (5) and (6), lift-off and dry etching patterns can be formed at low cost.

Although some preferred embodiments have been described, many modifications and variations may be made thereto in the light of the above teachings. It is therefore to be understood that within the scope of the appended claims, the invention may be practiced otherwise than as specifically described.

We claim:

1. A magnetoresistance thin film element comprising a magnetoresistance film and an electrode film therefor, at least one layer of which is formed by a lift-off technique using a resist pattern as a resist cover, wherein said resist pattern is substantially homogeneous and is formed on a surface of a substrate from a resist composition comprising a positive resist compound containing a mixture of an alkali soluble phenol resin and a naphthoquinone-diazide and a negative working agent added to the positive resist compound for imparting an image reversal function, and said resist pattern has a T-shaped cross section including a stem portion extending from the substrate surface and substantially continuing the vertical bar of T and a cap portion connected to the stem portion, opposed to the substrate surface with a spacing and substantially constituting the horizontal bar of T, provided that $\alpha$ is a minimum of the angle which is defined between a tangent at the lower edge of said cap portion opposed to the substrate surface and the substrate surface, and h is the spacing between the lower edge of the cap portion and the substrate surface at an intermediate position between the crossing Wo between a line extending from the outermost edge of the cap portion perpendicular to the substrate surface and the substrate surface and the crossing Wi between the side edge of the stem portion and the substrate surface, said minimum angle $\alpha$ and said spacing h fall within a range defined and encompassed by tetragon ABCD in a h-$\alpha$ graph wherein A: $\alpha=0°$, h=0.01 μm,
B: $\alpha=20°$, h=0.01 μm,
C: $\alpha=20°$, h=0.2 μm, and
D: $\alpha=0°$, h=0.3 μm.

2. The magnetoresistance thin film element according to claim 1, wherein said $\alpha$ and said h fall within a range defined and encompassed by tetragon AXYZ in the h-$\alpha$ graph wherein A: $\alpha=0°$, h=0 01 μm,
X: $\alpha=5°$, h=0.01 μm,
Y: $\alpha=5°$, h=0.15 μm, and
Z: $\alpha=0°$, h=0.15 μm.

3. The magnetoresistance thin film element according to claim 1, wherein said $\alpha$ and said h fall within a range defined and encompassed by tetragon AXGH in the h-$\alpha$ graph wherein A: $\alpha=0°$, h=0.01 μm,
X: $\alpha=5°$, h=0.01 μm,
G: $\alpha=5°$, h=0.1 μm, and
H: $\alpha=0°$, h=0.1 μm.

4. The magnetoresistance thin film element according to claim 1, wherein the distance W between the crossing Wo between a line extending from the outermost edge of the cap portion perpendicular to the substrate surface and the substrate surface and the crossing Wi between the side edge of the stem portion and the substrate surface is 0.03 to 3 μm.

5. The magnetoresistance thin film element according to claim 1, wherein said cap portion has a maximum width Hw of 0.1 to 7 μm as measured parallel to the substrate surface.

6. The magnetoresistance thin film element according to claim 5, wherein said stem portion has a width Vw adjacent to the substrate surface wherein Vw/Hw is from 0.1 to 0.995.

7. The magnetoresistance thin film element according to claim 1, wherein at least the substrate surface of said resist element is formed of a metal or ceramic material.

8. A magnetoresistance thin film element comprising a magnetoresistance film, an electrode film therefor, and a shield film, at least one layer of which is formed by a milling patterning technique using a resist pattern as a resist cover, wherein said resist pattern is substantially homogeneous and is formed on a surface of a substrate from a resist composition comprising a positive resist compound containing a mixture of an alkali soluble phenol resin and a naphthoquinone-diazide and a negative working agent added to the positive resist compound for imparting an image reversal function, and said resist pattern has a T-shaped cross section including a stem portion extending from the substrate surface and substantially continuing the vertical bar of T and a cap portion connected to the stem portion, opposed to the substrate surface with a spacing and substantially constituting the horizontal bar of T, provided that $\alpha$ is a minimum of the angle which is defined between a tangent at the lower edge of said cap portion opposed to the substrate surface and the substrate surface, and h is the spacing between the lower edge of the cap portion and the substrate surface at an intermediate position between the crossing Wo between a line extending from the outermost edge of the cap portion perpendicular to the substrate surface and the substrate surface and the crossing Wi between the side edge of the stem portion and the substrate surface, said minimum angle $\alpha$ and said spacing h fall within a range defined and encompassed by tetragon ABCD in a h-$\alpha$ graph wherein A: $\alpha=0°$, h=0.01 µm, B: $\alpha=20°$, h=0.01 µm, C: $\alpha=20°$, h=0.2 µm, and D: $\alpha=0°$, h=0.3 µm.

9. The magnetoresistance thin film element according to claim 8, wherein said $\alpha$ and said h fall within a range defined and encompassed by tetragon AXYZ in the h-$\alpha$ graph wherein A: $\alpha=0°$, h=0.01 µm, X: $\alpha=5°$, h=0.01 µm, Y: $\alpha=5°$, h=0.15 µm, and Z: $\alpha=0°$, h=0.15 µm.

10. The magnetoresistance thin film element according to claim 8, wherein said $\alpha$ and said h fall within a range defined and encompassed by tetragon AXGH in the h-$\alpha$ graph wherein A: $\alpha=0°$, h=0.01 µm, X: $\alpha=5°$, h=0.01 µm, G: $\alpha=5°$, h=0.1 µm, and H: $\alpha=0°$, h=0.1 µm.

11. The magnetoresistance thin film element according to claim 8, wherein the distance W between the crossing Wo between a line extending from the outermost edge of the cap portion perpendicular to the substrate surface and the substrate surface and the crossing Wi between the side edge of the stem portion and the substrate surface is 0.03 to 3 µm.

12. The magnetoresistance thin film element according to claim 8, wherein said cap portion has a maximum width Hw of 0.1 to 7 µm as measured parallel to the substrate surface.

13. The magnetoresistance thin film element according to claim 12, wherein said stem portion has a width Vw adjacent to the substrate surface wherein Vw/Hw is from 0.1 to 0.995.

14. The magnetoresistance thin film element according to claim 8, wherein at least the substrate surface of said resist element is formed of a metal or ceramic material.

15. A magnetoresistance thin film element comprising a patterned continuous film constituting a magnetoresistance film and an electrode film therefor, said films being formed by a milling patterning and lift-off technique using a resist pattern as a resist cover, wherein said resist pattern is substantially homogeneous and is formed on a surface of a substrate from a resist composition comprising a positive resist compound containing a mixture of an alkali soluble phenol resin and a naphthoquinone-diazide and a negative working agent added to the positive resist compound for imparting an image reversal function, and said resist pattern has a T-shaped cross section including a stem portion extending from the substrate surface and substantially continuing the vertical bar of T and a cap portion connected to the stem portion, opposed to the substrate surface with a spacing and substantially constituting the horizontal bar of T, provided that $\alpha$ is a minimum of the angle which is defined between a tangent at the lower edge of said cap portion opposed to the substrate surface and the substrate surface, and h is the spacing between the lower edge of the cap portion and the substrate surface at an intermediate position between the crossing Wo between a line extending from the outermost edge of the cap portion perpendicular to the substrate surface and the substrate surface and the crossing Wi between the side edge of the stem portion and the substrate surface, said minimum angle $\alpha$ and said spacing h fall within a range defined and encompassed by tetragon ABCD in a h-$\alpha$ graph wherein A: $\alpha=0°$, h=0.01 µm, B: $\alpha=20°$, h=0.01 µm, C: $\alpha=20°$, h=0.2 µm, and D: $\alpha=0°$, h=0.3 µm.

16. The magnetoresistance thin film element according to claim 15, wherein said $\alpha$ and said h fall within a range defined and encompassed by tetragon AXYZ in the h-$\alpha$ graph wherein A: $\alpha=0°$, h=0.01 µm, X: $\alpha=5°$, h=0.01 µm, Y: $\alpha=5°$, h=0.15 µm, and Z: $\alpha=0°$, h=0.15 µm.

17. The magnetoresistance thin film element according to claim 15, wherein said $\alpha$ and said h fall within a range defined and encompassed by tetragon AXGH in the h-$\alpha$ graph wherein A: $\alpha=0°$, h=0.01 µm, X: $\alpha=5°$, h=0.01 µm, G: $\alpha=5°$, h=0.1 µm, and H: $\alpha=0°$, h=0.1 µm.

18. The magnetoresistance thin film element according to claim 15, wherein the distance W between the crossing Wo between a line extending from the outermost edge of the cap portion perpendicular to the substrate surface and the substrate surface and the crossing Wi between the side edge of the stem portion and the substrate surface is 0.03 to 3 µm.

19. The magnetoresistance thin film element according to claim 15, wherein said cap portion has a maximum width Hw of 0.1 to 7 µm as measured parallel to the substrate surface.

20. The magnetoresistance thin film element according to claim 19, wherein said stem portion has a width Vw adjacent to the substrate surface wherein Vw/Hw is from 0.1 to 0.995.

21. The magnetoresistance thin film element according to claim 15, wherein at least the substrate surface of said resist element is formed of a metal or ceramic material.

* * * * *